United States Patent
Sun et al.

(10) Patent No.: US 12,029,129 B2
(45) Date of Patent: Jul. 2, 2024

(54) METHOD AND APPARATUS FOR TUNING FILM PROPERTIES DURING THIN FILM DEPOSITION

(71) Applicant: Applied Materials, Inc., Santa Clara, CA (US)

(72) Inventors: Lizhong Sun, San Jose, CA (US); Xiao Dong Yang, Xi'an (CN)

(73) Assignee: Applied Materials, Inc., Santa Clara, CA (US)

( * ) Notice: Subject to any disclaimer, the term of this patent is extended or adjusted under 35 U.S.C. 154(b) by 683 days.

(21) Appl. No.: 17/156,491

(22) Filed: Jan. 22, 2021

(65) Prior Publication Data
US 2021/0249587 A1 Aug. 12, 2021

Related U.S. Application Data

(63) Continuation of application No. PCT/CN2020/074419, filed on Feb. 6, 2020.

(51) Int. Cl.
*H10N 30/076* (2023.01)
*H10N 30/00* (2023.01)
*H10N 30/05* (2023.01)

(52) U.S. Cl.
CPC .......... *H10N 30/076* (2023.02); *H10N 30/05* (2023.02); *H10N 30/10513* (2023.02)

(58) Field of Classification Search
CPC ................. H10N 30/076; H10N 30/05; H10N 30/10513; H10N 30/853; H01J 37/32724;
(Continued)

(56) References Cited

U.S. PATENT DOCUMENTS 7,432,201 B2  10/2008 Takehara et al.
7,655,571 B2   2/2010 Kawaguchi et al.
(Continued)

FOREIGN PATENT DOCUMENTS

CN    1893265 A    1/2007
CN  101535524 A    9/2009
(Continued)

OTHER PUBLICATIONS

Machine translation of CN103924204 (Year: 2014).*
(Continued)

*Primary Examiner* — Emily P Pham
(74) *Attorney, Agent, or Firm* — Patterson + Sheridan, LLP

(57) ABSTRACT

Disclosed herein is an apparatus and method for fine tuning properties of a thin film. The method of forming a piezoelectric film includes (a) depositing a first piezoelectric film layer on a surface of a substrate by a first physical vapor deposition (PVD) process. The method includes (b) depositing a second piezoelectric film layer, on top of and in contact with the first piezoelectric film layer, by a second PVD process. A temperature of the substrate is (c) reduced after forming the first piezoelectric film layer and before forming the second piezoelectric film layer. The temperature is reduced by performing a process for a first period of time. Processes (a), (b) and (c) are additionally performed one or more times. Process (c) is performed for a second period of time. The second period of time is different than the first period of time.

20 Claims, 7 Drawing Sheets

(58) Field of Classification Search
CPC .............. H01J 37/32899; H01J 37/3405; H01J 37/3429; C23C 14/024; C23C 14/0022; C23C 14/0617; C23C 14/345; C23C 14/35; C23C 14/541; C23C 14/564; C23C 14/568; C23C 14/3492; C23C 14/0036; C23C 14/0641; C23C 28/04

See application file for complete search history.

(56) References Cited

U.S. PATENT DOCUMENTS

| | | | |
|---|---|---|---|
| 8,559,159 | B2 | 10/2013 | Roy et al. |
| 8,860,286 | B2 * | 10/2014 | Suenaga ............ H10N 30/8542 310/358 |
| 9,202,745 | B2 | 12/2015 | Or et al. |
| 9,437,802 | B2 * | 9/2016 | Li ...................... H10N 30/1051 |
| 10,574,204 | B2 * | 2/2020 | McCarron ............. C23C 14/566 |
| 2009/0246385 | A1 | 10/2009 | Felmetsger et al. |
| 2012/0107557 | A1 | 5/2012 | Akiyama et al. |
| 2016/0343552 | A1 | 11/2016 | Sun et al. |
| 2017/0169899 | A1 * | 6/2017 | Lal ......................... G11C 19/00 |

FOREIGN PATENT DOCUMENTS

| | | |
|---|---|---|
| CN | 102474234 A | 5/2012 |
| CN | 103924204 A | 7/2014 |
| CN | 105229810 A | 1/2016 |
| CN | 106244984 A | 12/2016 |
| JP | 2002217463 A | 8/2002 |
| JP | 2007116006 A | 5/2007 |
| WO | 2012058005 A2 | 5/2012 |
| WO | 2020097815 A1 | 5/2020 |
| WO | 2020211084 A1 | 10/2020 |

OTHER PUBLICATIONS

Zhang. Y., et al, "The preparation of ScAlN(002) alloy thin films deposited on Si(100) substrates by DC reactive magnetron sputtering", Journal of Materials Science: Materials in Electronics, vol. 26, No. 4, Jan. 9, 2015, pp. 2151-2160.

Extended European Search Report for Application No. 201918103.1 dated Oct. 2, 2023.

Japanese Office Action for Application No. 2022-547745 dated Oct. 17, 2023.

Chinese Office Action for Application No. 202080091672.1 dated Jan. 26, 2024.

Korean Office Action for Application No. 10-2022-7030586 dated May 8, 2024.

Chinese Office Action for Application No. 202080091672.1 dated Apr. 17, 2024.

* cited by examiner

METHOD AND APPARATUS FOR TUNING FILM PROPERTIES DURING THIN FILM DEPOSITION

CROSS-REFERENCE TO RELATED APPLICATIONS

This application claims benefit of PCT Application No: PCT/CN2020/074419, filed Feb. 6, 2020, all of which is incorporated by reference in its entirety.

BACKGROUND

Field

Examples disclosed herein relate to a method and apparatus used to fine tune the properties of a deposited thin film material.

Description of the Related Art

Thin film piezoelectric materials can be used in sensors and transducers. Piezoelectric sensors and transducers are also used in devices such as gyro-sensors, ink-jet printer heads and other Microelectromechanical systems (MEMS) devices, including acoustic resonator used in mobile phones and other wireless applications. These thin piezoelectric films can be fabricated by techniques such as sputtering, pulsed laser ablation (PLD), MOCVD, and sol-gel deposition.

In semiconductor processing, physical vapor deposition (PVD) (e.g., sputtering process) is a conventionally used process for depositing a thin film. A PVD process includes bombarding a target that has a source material. Ions are generated in a plasma within a chamber, causing the source material to be sputtered from the target to a substrate. During some PVD processes, the sputtered source material is then accelerated towards the substrate being processed via a voltage bias. The source material is deposited on the surface of the substrate. In some examples, the sputtered source material may react with another reactant. In the case of sputtering a fabricated layer on a substrate, epitaxial growth of the thin films can demonstrate strain and/or dislocated structure due to the thermal and lattice mismatch between the piezoelectric-based materials and the substrate.

During deposition of the sputtered material, a thickness and stress uniformity of the sputtered thin films may be affected by several controlled parameters. The controlled parameters can include a strength of a magnetic field used to trap electrons near the surface of a sputtering target, a lattice match or mismatch between adjacent materials, and crystal orientation of the substrate can make it difficult to maintain uniform properties of thin films. Such non-uniformity of thin films can cause fluctuation of with-in-wafer (WIW) piezoelectric properties and reduce production yield of piezoelectric devices.

Accordingly, there is a need for an improved method and apparatus for depositing piezoelectric materials and extending the lifetime of thin films used in sensing devices.

SUMMARY

Disclosed herein is an apparatus and method for fine tuning the properties of a thin film. In one example, a method of forming a piezoelectric film includes (a) depositing a first piezoelectric film layer on a surface of a substrate by a first physical vapor deposition (PVD) process. The method further includes (b) depositing a second piezoelectric film layer, on top of and in contact with the first piezoelectric film layer, by a second physical vapor deposition (PVD) process. The method continues by (c) reducing a temperature of the substrate after forming the first piezoelectric film layer and before forming the second piezoelectric film layer. The temperature is reduced by performing a process for a first period of time. Processes (a), (b) and (c) are additionally performed one or more times. Process (c), in the additionally performed processes (a), (b) and (c), is performed for a second period of time. The second period of time is different than the first period of time.

In another example, the method of forming a piezoelectric film includes (a) depositing, in a first processing chamber, a first piezoelectric film layer on a surface of a substrate by a first physical vapor deposition (PVD) process. The method includes (b) depositing, in the first processing chamber, a second piezoelectric film layer, on top of and in contact with the first piezoelectric film layer, by a second PVD process. The method continues by (c) reducing a temperature of a substrate after forming the first piezoelectric film and before forming the second piezoelectric film. The temperature is reduced by performing a process for a first period of time. Processes (a), (b) and (c) are additionally performed one or more additional times. The additionally performed process (c) is performed for a second period of time. The second period of time is different than the first period of time.

In yet another example, an apparatus for processing a substrate includes a processor coupled to at least one non-transitory computer readable medium. The at least one non-transitory computer readable medium includes instructions which when executed by the processor are configured to perform a method. The method includes (a) depositing a first piezoelectric film layer on a surface of a substrate by a first physical vapor deposition (PVD) process. Additionally, the method includes (b) depositing a second piezoelectric film layer, on top of and in contact with the first piezoelectric film layer, by a second physical vapor deposition (PVD) process. The method continues by (c) reducing a temperature of the substrate after forming the first piezoelectric film layer and before forming the second piezoelectric film layer. The temperature is reduced by performing a process for a first period of time. Processes (a), (b) and (c) are additionally performed one or more times. Process (c), in the additionally performed processes (a), (b) and (c), is performed for a second period of time. The second period of time is different than the first period of time.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only examples and are therefore not to be considered limiting of its scope, and may admit to other equally effective examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Figure 1:
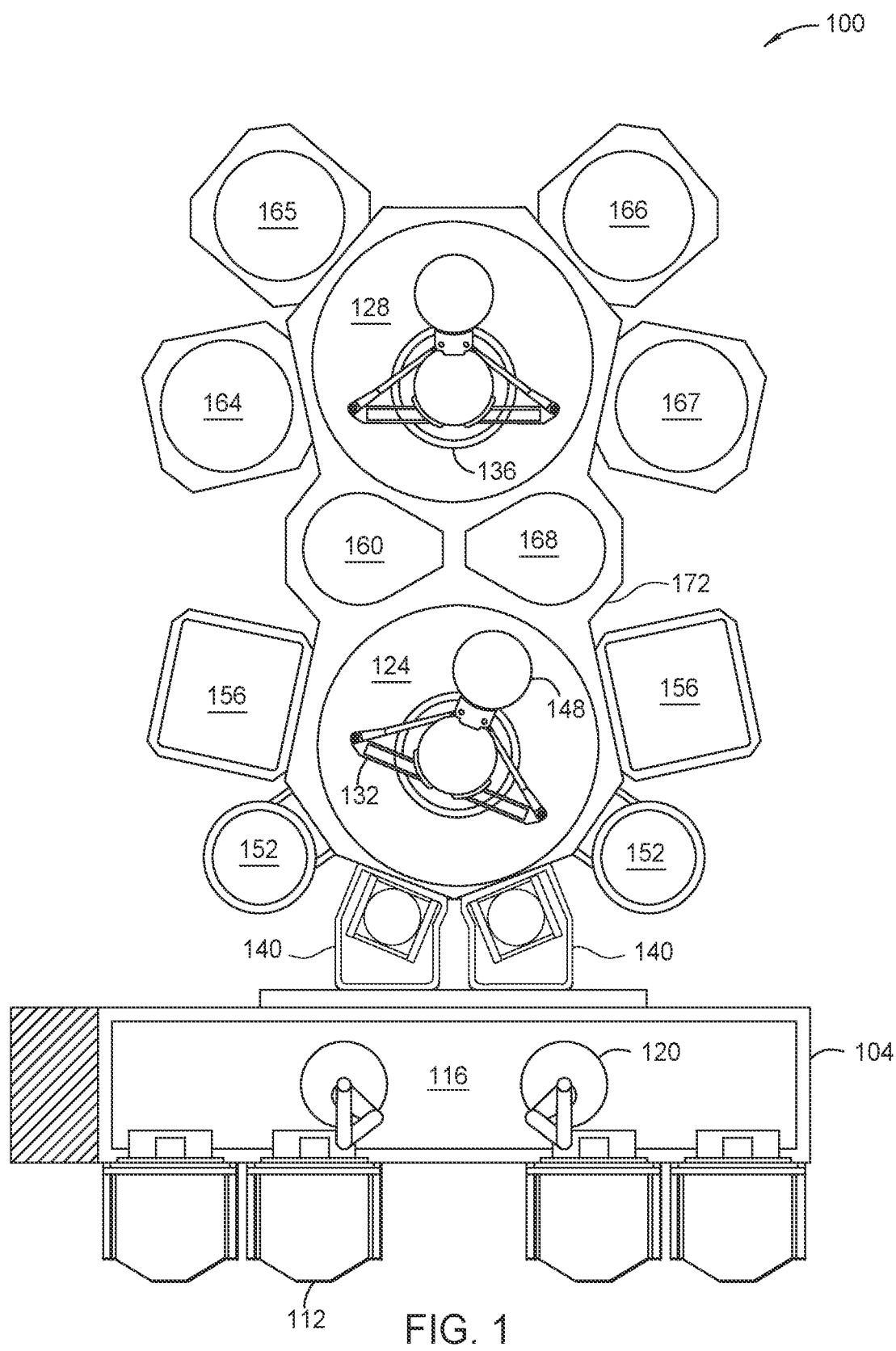
FIG. 1 is a plan view of a cluster tool that is adapted to deposit thin film layers on a substrate.

Disclosed herein is an apparatus and method for fine tuning the properties of a thin film during a thin film deposition process, such as a process that includes a sputtering process. When piezo-electric materials are deposited on a substrate at high temperatures, crystal orientation is improved, resulting in smaller full-width-half-maximum (FWHM) peaks due to the decrease in variation in the crystal orientation. However, when a thin film is formed at high substrate deposition temperatures, with-in-wafer (WIW) stress uniformity increases. In contrast, lower substrate temperatures correlate to better WIW stress uniformity, but larger FWHM peaks. The crystalline structures of the thin film layers disclosed herein were studied (or inspected) using X-ray diffraction (XRD). Therefore, a method is needed to solve the conflicting effects on variations in crystal orientation and film stress.

In an effort to address these competing effects, a multistep process sequence has been developed and is disclosed herein. The process sequence generally includes the formation of a first thin layer, so called a seed layer, and a second layer, or also referred to herein as a bulk layer, forms the rest of the deposited film thickness. In another example, the bulk layer is formed on top of and in contact with the substrate without a deposited seed layer. A separate temperature control is used during the deposition processes used to form the two layers. In one embodiment, the seed layer deposition process includes heating the substrate to a high temperature (e.g., 150° C.-550° C.) in a first chamber, such as a lamp heated chamber or heated substrate support pedestal containing chamber, and then depositing the seed layer in separate deposition chamber that has a substrate support that is maintained at a temperature that is less than the temperature that the substrate achieves in the first chamber. In one example, the seed layer deposition process includes a sputtering process that is adapted to form a piezo-electric material. The high temperature achieved by the substrate while the seed layer is formed provides a good surface condition for nucleation of the thin film layer and allows the formed crystals to have to have a preferred crystal orientation (e.g., small variation in crystal orientation). Afterwards, the substrate with the seed layer disposed thereon is sent to a different chamber for cooling. After the substrate is cooled, the substrate is sent back to the process chamber, which has a substrate support that is controlled to a temperature around room temperature to continue deposition of the bulk layer. It has been found that this deposition-cooling-deposition process sequence is able to avoid the conflict between the temperature effect on stress and crystal orientation, and instead, provides a positive effect to each property. Advantageously, the apparatus and method disclosed herein enables the formation of a thin layer that has both a smaller FWHM and an improved stress uniformity and stress level. The separate temperature control during the different parts of the processing sequence enables improved overall film properties by reducing film stress and improving crystal orientation.

During sputtering of the thin film layers, differences in surface properties of the thin film layers and/or one or more regions of the substrate surface can result in cone defects, stacking defects, and other surface defects. The defects increase surface roughness, weaken piezoelectric coupling between layers and ultimately degrade the performance of a formed piezoelectric device. During deposition of a high temperature seed layer, parameters such as degas temperature, pressure, bias power, target-substrate spacing, and gas ratio are adjusted in order to suppress the cone defects and improve the crystal quality of thin film layers.

The methods and apparatuses disclosed herein also enable the fine-tuning of the properties of a thin film by adjusting processing parameters during the formation of the bulk layer. In general, deposition process parameters, process time, and a cooling recipe process parameters are adjusted in order to improve stress uniformity and crystal orientation. The deposition process pressure, deposition bias power, sputter target power, gas ratio concentration (e.g., reactive gas to inert gas concentration ratio) are examples of adjustable deposition process parameters. The cooling process pressure, substrate support temperature, and cooling gas composition are examples of adjustable cooling process parameters. The deposition and cooling process parameters can be adjusted alone or in combination with the process time. Accordingly, by fine tuning the above-noted parameters while depositing the bulk layer, an increased within wafer (WIW) stress uniformity and crystal orientation of thin film properties are available.

FIG. 1 is a plan view of a cluster tool 100 that is adapted to deposit thin film layers on a substrate. One example of the cluster tool 100 is commercially available from Applied Materials, Inc. of Santa Clara, Calif., and is known as the Endura® system.

The cluster tool 100 includes a factory interface 104, loading dock 140, a first robot 132, and a second robot 136. An orient chamber 152, degas chamber 156, first processing chambers 160 and 168, second processing chambers 164-167, a second robot 136, and a main frame 172 are included in the cluster tool 100. The cluster tool 100 also includes a first transfer chamber 124 and a second transfer chamber 128.

Each cassette 112, or FOUP, is configured to receive a plurality of substrates 201. In this configuration, the substrates 201 are removed from the cassette 112, by one of the factory interface robots 120. The factory interface robots 120 will transfer the substrate 201 from the cassette 112 and load the substrate 201 into the loading dock 140 (i.e., load lock). Upon completion of substrate processing in the cluster tool 100, the processed substrates 201 are then returned to their respective cassette 112.

A main frame 172 includes the first transfer chamber 124 that includes a first robot 132. The first robot 132 is configured to move the substrate 201 between the orient chamber 152, degas chamber 156, and a first processing chamber 160. Each of the orient chamber 152, degas chamber 156, and a first processing chamber 160 is arranged around the periphery of the first transfer chamber 124. In some configurations, the first transfer chamber 124 is vacuum pumped to a moderately low pressure, for example, about 1 milliTorr or less. The second transfer chamber 128 is pumped to a lower pressure, for example, 1 microTorr or less. Accordingly, the first transfer chamber 124 or the second transfer chamber 128 is maintained at least at a moderate vacuum level to prevent the transfer of contamination between the first transfer chamber 124 and the second transfer chamber 128. It is understood that any discussion or description of the first processing chamber 160 necessarily includes the first processing chamber 168, unless explicitly stated otherwise.

A second robot 136 is configured to move the substrate(s) 201 between the first processing chamber 160 and a second processing chamber 164. The second robot 136 is disposed within the second transfer chamber 128. The second robot 136 is configured to transfer substrates 201 to and from the first processing chamber 160 and the second processing chamber 164 or other process chambers 165-168 attached to the second transfer chamber 128 portion of the main frame 172. In one configuration, each of the first robot 132 and the second robot 136 is a "frog-leg" type robot, available from Applied Materials, Inc. of Santa Clara, Calif. The first transfer chamber 124 can be selectively isolated from each of the orient chamber 152, degas chamber 156, and first processing chamber 160 by use of slit valves (not shown) that are disposed between each of the orient chamber 152, degas chamber 156, and first processing chamber 160. The second transfer chamber 128 can be selectively isolated from each of the first processing chamber 160 and the second processing chamber 164 by use of slit valves that are disposed between each of the first processing chamber 160 or the second processing chamber 164. Herein, it is understood that any discussion or description of the second processing chamber 164 includes any one of the second processing chambers 165-167.

Each loading dock 140 is each selectively isolated from both the first transfer chamber 124 by slit valves and from the exterior region 116 of the factory interface 104 by vacuum doors (not shown). In this configuration, the factory interface robots 120 in the factory interface are configured to move a substrate 201 from a cassette 112 to the loading dock 140. The substrate 201 is then isolated from the exterior region 116 of the factory interface 104 by the vacuum door (not shown) coupled to the loading dock 140. The substrate 201 is transferred to the loading dock 140. After the loading dock 140 is pumped down to a desired pressure, the substrate 201 can then be accessed by the first robot 132 through a slit valve opening (not shown) formed between the first transfer chamber 124 and the loading dock 140.

Each substrate 201 is loaded into a cassette 112 that is coupled to a factory interface 104. The substrate 201 may have a diameter in a range from about 100 mm to about 750 mm. The substrate 201 may be formed from a variety of materials, including Si, SiC or SiC-coated graphite. In one example, the substrate 201 includes a silicon carbide material and has a surface area of about 1,000 cm 2 or more. In another example, the surface area of the substrate 201 may be about 2,000 cm 2 or more, and about 4,000 cm 2 or more.

One or more orient chambers 152 may be used to align the substrate 201 in a desired rotational orientation within the cluster tool 100. By aligning the substrate 201, the substrate 201 is also aligned. The orient chamber 152 may be positioned proximate the loading dock 140 and proximate the degas chamber 156.

In some embodiments, the orient chambers 152 include a heat source, such as lamps or infrared generating radiant heaters. The heat source within the orient chambers 152 can be adapted to heat the substrate 201 and each substrate 201 to a desired temperature. The orient chambers 152 can be pressurized under a vacuum condition to ensure that any undesirable water or other contamination is removed from the surface of the substrate 201 prior to processing in other downstream chambers.

In some embodiments, the cluster tool 100 includes a pre-clean chamber 156 that is adapted to clean the surface of a substrate 201 by use of cleaning process that includes exposing the surface of the substrate to a radio frequency (RF) generated plasma and/or one or more pre-cleaning gas compositions that includes a carrier gas (e.g., Ar, He, Kr) and/or a reactive gas (e.g., hydrogen). In some embodiments, the pre-clean chamber 156 is adapted to perform a process that may include a non-selective sputter etching process. The pre-clean chamber 156 will typically include components similar to the components found in the pre-clean chamber 300, which is described below in conjunction with FIG. 3.

Each first processing chamber 160 is configured to process the substrate(s) 201 therein. Processing may include cooling the substrate, heating the substrate 201, etching and/or depositing one or more layers on a surface of the substrate 201. In one configuration, the first processing chamber 160 is configured to cool or heat a substrate 201.

Each of the processing chambers 164-167 are adapted to perform an etch and/or deposition process. In some embodiments, the deposition process may include a sputter deposition process (i.e., PVD deposition process). The sputter deposition process may also include temperature regulation step that is adapted to a cool down and/or control the temperature of the substrate during processing.

Figure 2:
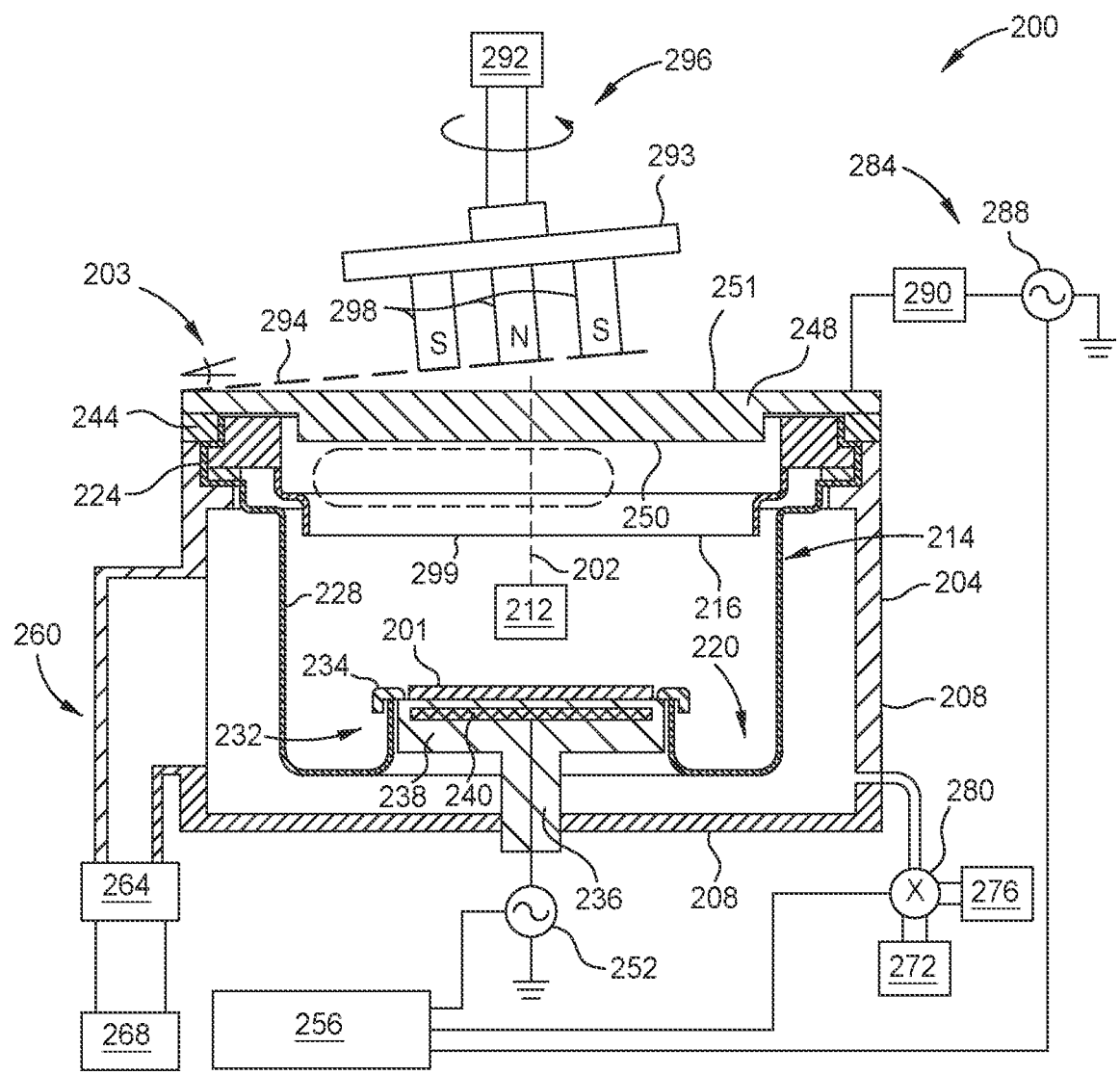
FIG. 2 is a plan view of one of the processing chambers that is adapted to deposit thin film layers on the substrate in the cluster tool illustrated in FIG. 1.

FIG. 2 is a plan view of a process chamber 200 that can be part of one or more of the processing chamber 164-167. The process chamber 200 is adapted to deposit thin film layers on the substrate 201 in the cluster tool illustrated in FIG. 1. The processing chamber 200 can be a magnetron type PVD chamber available from Applied Materials, Inc. of Santa Clara, Calif. The processing chamber 200 includes a chamber 204, a target 248, a magnetron 296, a vacuum pumping system 260, a substrate support assembly 232, and a process kit 214. In one example, the target 248 is a scandium (Sc) doped aluminum (Al) target. In one example, the target 248 is a scandium (Sc) doped aluminum (Al) target that has between about 1at % and 40 at % scandium. In another example, an aluminum (Al) target has between about 20 at % and 40 at % scandium, or between about 30 at % and 40 at % scandium. In yet another example, an aluminum (Al) target has between about 5 at % and 40 at % scandium, or between about 5 at % and 20 at % scandium. In another example, the target 248 may be made from Al.

The chamber 204 supports the target 248, which is sealed at one end of the chamber 204 through a target isolator 244 using a plurality of O-rings. The chamber 204 may be held under vacuum.

The process kit 214 includes an edge ring 234, a first shield 216 and the second shield 220 that are separated by a second dielectric shield isolator 224. The process kit 214 parts are positioned within the chamber 204 to protect the chamber wall 208. A metal within the process kit 214 is electrically grounded from the sputtered material that is generated in an interior volume 212. The first shield 216 may be permitted to float electrically and the second shield 220 is electrically grounded. In an alternate example, either or both of the first shield 216 or second shield 220 may be grounded, floating or biased to the same or different non-ground levels. The first shield 216 and second shield 220 may be made of stainless steel. An inner surface 228 may be bead-blasted or otherwise roughened to promote adhesion of the material sputter deposited on the inner surface 228.

The substrate support assembly 232 includes a pedestal 236. The pedestal 236 may include an electrostatic chuck 238 that has a supporting surface that is adapted to support a substrate 201 over an electrode 240. It is appreciated that other devices may be used to hold the substrate 201 in place during processing. Resistive heaters, refrigerant channels, and/or thermal transfer gas cavities, which are not illustrated in FIG. 2, may be formed in the pedestal 236 to provide thermal control of the substrate 201 during processing. The electrode 240, which is coupled to a first power supply 252, may apply an RF and/or a DC bias to the substrate 201 to attract a plasma 299 ionized deposition material and processes gases. In other applications, biasing of the substrate 201 may be reduced or eliminated to further reduce the potential for damage to the deposited thin film layer.

The target 248 has at least a surface portion made of a material to be sputter deposited on substrate 201. In one example, a pulsed DC, RF and/or a pulsed RF bias signal is applied to the target 248 by a second power source 284. The pulsed DC, RF and/or pulsed RF bias signal enables the deposition of an optional non-conductive layer, such as a PZT or aluminum nitride layer. In order to attract the ions generated by the plasma 299 to sputter the target 248, the target 248 may be biased by the second power source 284 to provide an average power of 1 to 20 kW, for example. The pulsed DC and/or RF bias signal applied to the target 248 may include a signal that has a plurality of alternating first and second intervals (detailed below). Each of the first intervals, the voltage of the applied bias signal is negative to attract ions to sputter the target 248. During the alternating second interval, the applied bias signal is lower than the bias applied during the first interval, unbiased (e.g., zero applied voltage). In some examples, the applied bias signal has a positive voltage to repel positively charged ions from the target 248 to reduce arcing.

One skilled in the art will appreciate that the pulsed bias signal applied to the target 248 can provide many beneficial processing advantages, depending upon the particular application. For example, the pulsed bias signal may be used to reduce the deposition rate, form plasma 299, and increase the peak energy in the plasma 299 for effectively controlling a plasma chemistry to form a film stack 400 (illustrated in FIG. 4). For example, thin film layers which are closer to stoichiometric proportions might be obtained when a pulsed biasing signal is applied to the target 248. Still other possible features include an increase in thin film quality, particularly for the film stack 400. Additionally, thin film sheet resistance may be reduced, due to possible elimination of undesirable micro voids and columnar structures, when a pulsed bias is applied. It is appreciated that in some examples, a non-pulsed biasing signal may be applied to bias the target 248 during one or more parts of the deposition process, or in combination with a pulsed bias signal. The non-pulsed biasing signal can be a constant DC or an RF power level bias signal.

The substrate 201 mounted on the pedestal 236 can be biased to attract or repel ions generated in the formed plasma 299. For example, the first power supply 252 may be provided to apply RF power to the pedestal 236 to bias the substrate 201 to attract deposition material ions during the deposition process. In addition, the first power supply 252 may be configured to apply RF power to the electrode 240 of pedestal 236 to couple supplemental energy to the plasma 299. During the deposition process, the pedestal 236 may be electrically floating. Accordingly, a negative DC bias may nonetheless develop on the pedestal 236. Alternatively, the pedestal 236 may be biased by a source at a voltage of between −1000 Volts to +500 Volts, such as about −30 VDC. For example, the pedestal 236 may be biased in order to bias the substrate 201, attracting the ionized deposition material to the substrate 201. In some configurations, a capacitor tuner (not shown) can be used with the second power source 284 to control the floating potential on the substrate 201 during processing. In an alternative example, the substrate 201 may be left floating electrically.

If the first power supply 252, used to bias the substrate 201 through the pedestal 236, is an RF power supply, the supply may operate at a frequency of about 13.56 MHz to about 60 MHz. The pedestal 236 may be supplied with RF power in a range of 10 watts to 5 kW. A computer-based controller 256 may be programmed to control the power levels, voltages, currents and frequencies. Accordingly, it is understood that the above-mentioned power level, voltage level, and frequencies may vary according to the program.

The vacuum pumping system 260 includes a pump assembly 268 and valve 264. The pump assembly 523 may include a cryopump, roughing pump(s) (not shown) that are used to maintain a desirable pressure in the interior volume 212 of the processing chamber 200.

The magnetron 296 is disposed adjacent to and is rotated relative to the target 248. A plurality of magnets 298 is included in the magnetron 296. The plurality of magnets 298 include plural polarized magnets N, and plural magnets S having an opposite polarization to magnets N. The magnets 298 are used to confine plasma 299 generated in the interior volume 212 by biasing the target 248 using the second power source 284 to sputter material from a front surface 250 of the target 248. The second power source 284 has a second power supply 288 that is configured to deliver DC and/or RF power to the target 248. In some example, delivery of RF power to the second power source 284 may also include a match circuit 290.

The magnetron 296 can be tilted with respect to a surface of the target 248, such as the front surface 250 or back surface 251. In other words, the magnetron 296 forms an angle 203 with respect to a central axis 202 or the axis of rotation of the magnetron 296. The tilting of the magnetron 296 at an angle 203 may be controlled by the controller 256 via the motor 292. The degree of the tilting of the magnetron 296 may be adjusted between processing batches, between substrates 201, or in-situ during the processing of the substrate(s) 201. The angle 203 at which the magnetron 296 is tilted may be controlled based on thin film thickness or stress data feedback. The specific component of the magnetron 296 that is tilted at the angle 203 with respect to the target 248 may vary. In one example, the longitudinal dimension of the backing plate 293 (e.g., yoke) is tilted at the angle 203 with respect to the target 248. In one example, a plane 294 (e.g., parallel to the X-Y plane) defined by lower ends of magnets 298 facing the back surface 251 of the target 248 is tilted at the angle 203 with respect to the target 248. In one example, the magnetron 296 is tilted with respect to the back surface 251 of the target 248. In another example, the magnetron is tilted with respect to the front surface 250.

In one embodiment, when the magnetron 296 is rotated about the central axis 202 by a rotation motor 292 during processing, the angle 203 is maintained between the magnetron 296 and the target 248, such that any point on the magnetron 296, as is rotated about the central axis 202, will remain the same vertical distance (i.e., Z-direction distance) from a surface of the target 248, such as the back surface 251. As the magnetron 296 rotates, the strength of the magnetic field produced by the magnetron 296 is an average of the various strengths of magnetic fields produced by each magnet 298. The magnetic field is averaged across the front surface 250 of the target 248. The averaging of the strengths of the magnetic fields enables uniform thin film properties and uniform erosion of the target 248.

The angle 203 is determined by establishing an angle between the back surface 251, as shown in FIG. 2, of the target 248 and the plane 294 of the magnetron 296. Another manner of determining the angle 203 is establishing an angle between the front surface 250 of the target 248 and the plane 294 of the magnetron 296. For simplicity, any discussion of the angle 203 formed between the magnetron 296 and the target 248, necessarily include the surfaces 250 or 251 of the target 248 and the plane 294 of the magnetron 296. The angle 203 formed between the magnetron 296 and the target 248 may be from about 0.2 degrees to about 5 degrees. In another example, the angle 203 is from about 1 degree to about 2 degrees. If the angle 203 of the tilting of the magnetron 296 with respect to the target 248 is less than about 0.2 degrees, the effect of the averaging of the magnetic fields strengths can be diminished. As noted, the angle 203 of the tilted magnetron 269 with respect to the target 248 is less than or equal to about 5 degrees. Accordingly, the magnetron 296 and the central axis 202 form an acute angle (not labelled) ranging from about 85 degrees to about 89.7 degrees. The acute angle may range from about 88 degrees to about 89 degrees. A sum of the angle 203 and the acute angle is typically 90 degrees.

A first gas source 272 supplies a gas to the chamber 204 through a mass flow controller 280. One example of the gas is a chemically inactive noble gas, such as argon (Ar). The gas can be admitted to the top of the chamber 204, or as illustrated, at the bottom of the chamber 204. One or more inlet pipes (not illustrated) penetrate apertures through the bottom of a second shield 220. Alternatively, inlet pipes may be coupled to apertures within the pedestal 236. During PVD processes, a nitrogen (N) gas may be delivered from a second gas source 276 to form a layer on the substrate 201. The layer may include a material such as aluminum nitride (AlN).

Figure 3:
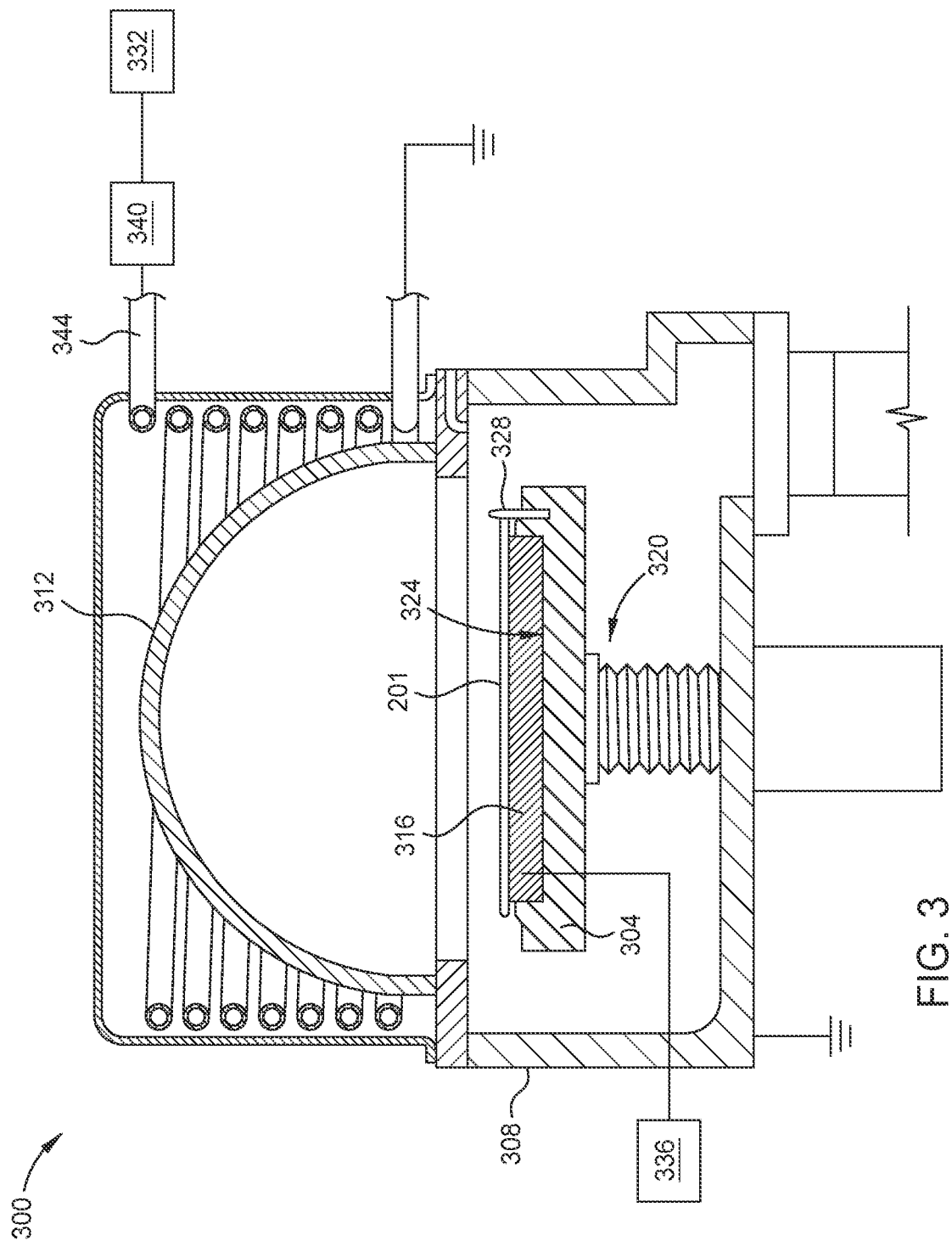
FIG. 3 is a cross sectional view of another processing chamber adapted to process the substrate in the cluster tool illustrated in FIG. 1.

FIG. 3 is a cross sectional view of another processing chamber 300 adapted to process the substrate in the cluster tool illustrated in FIG. 1. An example of the processing chamber 300 useful for the present disclosure is the Pre-Clean II Chamber available from Applied Materials, Inc., Santa Clara, CA.

The pre-clean chamber 300 has a substrate support assembly 304 disposed in a chamber enclosure 308 under a dome 312. In one example, the dome 312 may be made from quartz. The pedestal 320 includes the substrate support assembly 304 having a substrate support 316. The substrate support 316 is disposed within a recess 324 on the substrate support assembly 304. During processing, the substrate 201 is placed on the substrate support 316. At least one locating pin 328 retains the substrate in a desired lateral position on the substrate support 316.

A coil 344 is disposed outside of the dome 312 and connected to an RF power source 332. The RF power source 332 initiates and maintains a plasma formed from the process gases within the processing chamber 300. An RF match network 340 is provided to match the RF power source 332 and the coil 344. The substrate support assembly 304 is connected to a DC power source 336 that provides a bias to the substrate support assembly 304.

Figure 4:
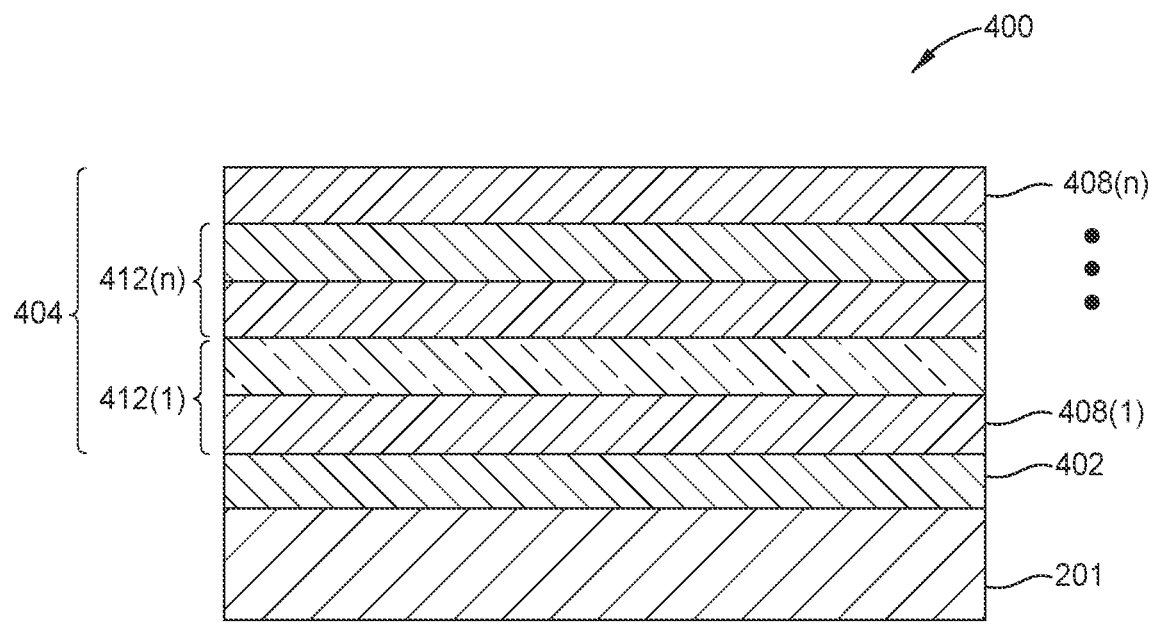
FIG. 4 is a side view of an exemplary film stack produced within the cluster tool disclosed in FIG. 1.

The substrate 201 may be pre-cleaned or etched using the plasma in the processing chamber 300 prior to depositing one or more layer within a film stack 400, as shown in FIG. 4. Once the substrate 201 is positioned for processing in the processing chamber 300, a processing gas is introduced into the interior volume 212. The processing gas may include between about 0% and about 100% hydrogen (H) and the balance a carrier gas. The processing gas may be between about 5% and about 50% of H.

The processing gas can include a carrier gas, such as Ar or helium (He), at a concentration of between about 95% and about 50%. The processing gas is ignited in the interior volume 212 to form the plasma, thus subjecting the substrate 201 to the plasma. For example, plasma may be generated by applying between about 50 W and about 500 W of power from the RF power source 332 to the coil 344. The DC power source 336 may also provide power between about 10 W and about 300 W of DC bias power. The plasma may be maintained for a period between about 10 seconds and about 300 seconds. Once the pre-cleaning process is completed, processing chamber 300 is evacuated to exhaust the processing gas and the reacted byproducts from the processing chamber 300.

FIG. 4 is a side view of an exemplary film stack 400 produced within the cluster tool disclosed in FIG. 1. The film stack 400 may include the substrate 201, an optional seed layer 402, and a bulk layer 404. In an alternate embodiment, the bulk layer 404 is formed on top of and in contact with a surface of the substrate 201. The bulk layer 404 may include one or more interlayer(s) 408, where each interlayer 408 may be expressed as 408($n$), where n is the number of interlayers 408 in the bulk layer 404 that may vary from 1 to n. For example, while n=4 in the example illustrated in FIG. 4, in an alternate example, n is from 1 to 40, or even 2 to 30. Thus, a first interlayer 408(1) is a first piezoelectric film layer, a second interlayer 408(2) is a second piezoelectric film layer, and so forth up to an nth interlayer 408($n$) is a nth piezoelectric film layer.

In one example, the bulk layer 404 is scandium-doped aluminum nitride (ScAlN). In another example, the bulk layer 404 is AlN. The substrate 201, in some examples, has a crystal orientation of <001>. The substrate 201 may include other layers having an appropriate lattice, including but not limited to a polycrystalline molybdenum, and AlN.

Figure 5:
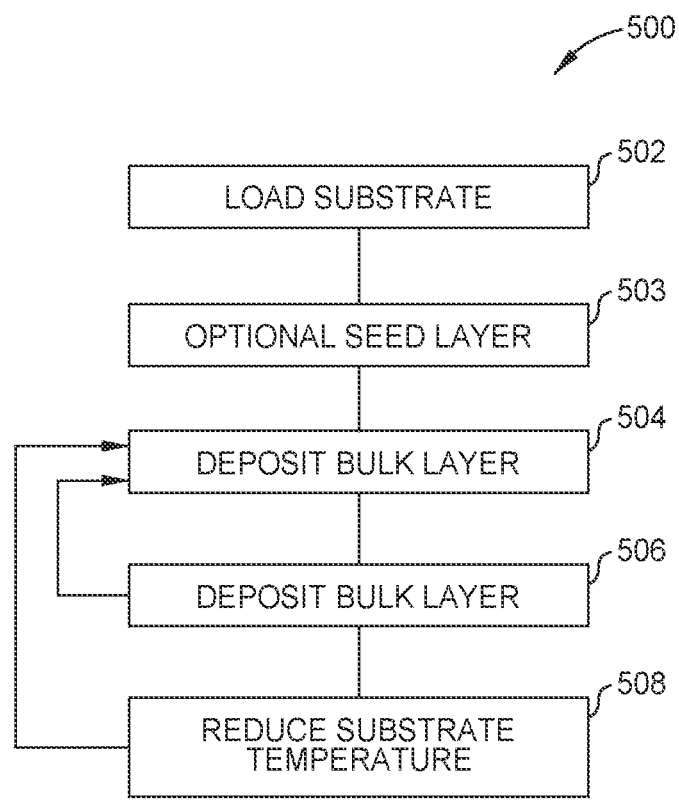
FIG. 5 is a flow chart depicting an exemplary method of producing the film stack within the cluster tool illustrated in FIG. 1.

FIG. 5 is a flow chart depicting an exemplary method 500 of producing the film stack 400 within the cluster tool illustrated in FIG. 1.

At block 502, the substrate 201 is loaded into the loading dock 140 of the cluster tool 100. In an example, the first robot 132 moves the substrate 201 to the orient chamber 152. The substrate 201 is passed through the first transfer chamber 124 by the first robot 132. The first robot 132 in the first transfer chamber 124 moves the substrate 210 from the orient chamber 152 to the first processing chamber 160. As stated above, pressure (P) in the first transfer chamber 124 may be about 1 microTorr. Accordingly, the pressure is held in a vacuum state. As detailed above, process gas is supplied to first processing chamber 160.

Optionally, at block 503, the seed layer 402 is formed on the substrate 201. During block 503 the substrate 201 is heated within a heated process chamber (e.g., degas chamber 156) to a desired first temperature (e.g., temperature between 200° C. to 600° C.) and then a seed layer is formed on the substrate in a second processing chamber 164 at a second processing temperature (e.g., temperature less than or substantially equal to the degas temperature). The seed layer 402 can be formed in the second processing chamber that includes the components shown in processing chamber 200. The process performed during block 503 may include delivering a pulsed DC, RF and/or a pulsed RF bias signal to the target 248 by the second power source 284 to form a sputtered material layer. In one example, the incoming substrate temperature to the second processing chamber, and thus substrate processing temperature, is greater than room temperature, such as between about 120° C. and about 600° C. In one example, the seed layer 402 has a thickness from about 10 nm to about 50 nm. It has been found that, by maintaining a high initial temperature (e.g., degas temperature), defects formed in the seed layer 402 decrease.

At block 504, the bulk layer 404 is formed on or over the substrate 201. As noted above, process gas is supplied to the second processing chamber 164. The bulk layer 404 can be formed in the second processing chamber 164 that includes the components shown in processing chamber 200. The bulk layer 404 includes at least one interlayer 408 that is formed on or over the substrate 201 in the second processing chamber 164. In one example, a first interlayer 408(1) of the bulk layer 404 can be formed to a thickness from about 0.01 microns to 0.1 micron. In one example, the bulk layer 404 can be formed to a total thickness from about 0.2 to 10 microns, or such as about 0.4 microns to 10 microns. In another example, the bulk layer 404 can be formed to a total thickness of about 0.2 microns to about 0.5 microns. In yet another example, the bulk layer 404 can be formed to a total thickness of about 0.2 microns to about 2 microns, or a total thickness of about 0.3 microns to about 2 microns, or a total thickness of about 0.5 microns to about 1 micron. In an alternative example, the bulk layer 404 can be any desired thickness between about 0.2 microns to about 10 microns However, the thickness of the bulk layer 404 is not limited to this range and may be deposited on the substrate 201 to any desired thickness.

In some embodiments, the bulk layer 404 is formed on the substrate during block 504 may include two or more processing steps, such as blocks 504-508 as shown in FIG. 5. In some embodiments, the first interlayer 408(1) of the bulk layer 404 is formed at a temperature between about room temperature (~20° C.) and about 180° C. In some embodiments, the first processing chamber 160 is maintained at room temperature when the film stack 400 is cooled in the first processing chamber 160. In some embodiments, the bulk layer 404 is formed in an environment including Ar and N. In one example, the ratio of Ar to N may be about 2 to 1 by volume. In another example, the ratio of Ar to N may be about 1 to 1 by volume. During block 504 the first power supply 252 applies a first power bias P1 to the substrate 201 using the electrode 240 for a first duration of time (t1). A first interlayer 408(1) is formed on the film stack 400. A first bias power P1 is between about 30 Watts and about 150 Watts.

A second interlayer 408(2) is formed on top of and in contact with the first interlayer 408(1), at block 506. In one example, a second interlayer 408(2) of the bulk layer 404 can be formed to a thickness from about 0.01 microns to 0.1 micron. A second power bias P2 is applied to the substrate 201 through the electrode 240 from the first power supply 252, for a second duration of time (t2). The first duration of time is between about 1 second and about 200 seconds. In another example, the first duration of time and the second duration of time is between about 1 second and about 60 seconds, such as about 1 second and 20 seconds, or such as about 1 second and 40 seconds. The second duration of time is greater than 300 seconds and less than or equal to about 2000 seconds. In one example, the first time may be about 470 seconds and the second time can be about 1080 seconds. A second bias power P2 is less than about 120 Watts and greater than or equal to 20 watts. For example, the first bias power P1 may be about 100 watts and the second bias power P2 may be about 60 watt. In another example, the second bias power P2 can be about 80 Watts.

The first interlayer 408(1) and the second interlayer 408(2) are formed in the same second processing chamber 164. In an alternative example, the first interlayer 408(1) may be formed in one of the second processing chamber 164, and the second interlayer 408(2) may be formed in a different second processing chamber 165 of the cluster tool 100. Accordingly, in at least one example, the first bias power P1 is higher than the second bias power P2. In the same example, the second duration of time (t2) is greater than the first duration of time (t1). An exemplary frequency of either the first bias power P1 or second bias power P2 is about 13.56 MHz. In some embodiments, the process recipe parameters, or process variables, used to deposit the first interlayer 408(1) are different from the process recipe parameters used to deposit the second interlayer 408(2). In one example, a process used to deposit the first interlayer 408(1) and a process used to deposit the second interlayer 408(2) have at least one process parameter that is different, wherein the at least one process parameter is selected from a group consisting of deposition process pressure, bias power and the deposition process time.

At block 508, the temperature of the film stack 400 is reduced. Prior to reducing the temperature at block 508, the film stack 400 includes at least the substrate 201 and the bulk layer 404. In one example, the film stack 400 is transferred from the second processing chamber 164 to the first processing chamber 160 in order to cool the film stack 400. The first processing chamber 160 may be maintained at a reduced temperature, when the substrate 201 is cooled in the first processing chamber 160. In another example, the film stack 400 is not transferred to the first processing chamber 160, but is subject to the reduced temperature in the second processing chamber 164. The reduced temperature may be achieved by removing heat from the interior volume 212, e.g., by discontinuing the supply of power to the second power source 284 or chucking the substrate 201 to the cooled pedestal 236. In another example, the bulk layer 404 may be deposited in interlayer pairs 412. Each interlayer pair 412 may be expressed as 412(n), where n is the number of interlayers 412 in the bulk layer 404 that may vary from 1 to n. For example, while n=2 in the example illustrated in FIG. 4, in an alternate example, n is from 1 to 15. As shown, a first interlayer pair 412(1) includes the first interlayer 408(1) and the second interlayer 408(2). At block 508, the temperature of the film stack 400 may be reduced between successive interlayer pairs 412 (e.g. 412(n) and 412(n+1)). In yet another example, the temperature at block 508 may be reduced after deposition of the interlayer 408(n) at block 504 before deposition of another interlayer 408(n+1) at block 506. In this example, the film stack 400 is cooled between a depositions of the interlayer 408(n) at block 504 and a deposition of interlayer 408 (n+1) at block 506.

In one example, the film stack 400 temperature can be reduced by pausing the deposition process for a period time, $\Delta t_{cool}$. Plasma is not directed to film stack 400 while deposition is paused. The deposition may be paused for a period of time $\Delta t_{cool}$ from about 1 second to about 50 seconds, such as about 3 seconds to about 50 seconds. The period of time, $\Delta t_{cool}$, may be referred to as pausing period of time when the deposition process is paused. In another example, the period of time $\Delta t_{cool}$ at which deposition is paused is between about 10 seconds and 20 seconds. In another example, the period of time $\Delta t_{cool}$ is less than or equal to about 40 seconds. The period of time $\Delta t_{cool}$ can be from about 6 seconds and about 60 seconds. In yet another example, when deposition of the film stack 400 is paused, the period of time $\Delta t_{cool}$ can be paused for any desired period of time between about 1 second to about 60 seconds, incremented by 1 second.

When the film stack 400 is actively cooled, the substrate 201 of the film stack 400 is placed on top of and in direct contact with a temperature regulated body, such as the substrate support 316. Alternatively, the substrate 201 may be placed on top of and in direct contact with the electrostatic chuck 238. The substrate support 316 or the electrostatic chuck 238 may have a temperature lower than the substrate 201, and thus can be used to actively cool the substrate 201. The temperature is reduced for the period time, $\Delta t_{cool}$. The period of time $\Delta t_{cool}$ can be any period of time from about 1 second to about 50 seconds. In one example, the period of time $\Delta t_{cool}$ is between about 10 seconds and 20 seconds. In another example, the period of time $\Delta t_{cool}$ is about 40 seconds. As the period of time $\Delta t_{cool}$ increases, stress (MPa) decreases between the crystal structures in the film stack 400. As stated above, the substrate 201, and therefore the film stack 400, can be cooled in an environment that includes Ar and $N_2$. In one example, the period of time $\Delta t_{cool}$ at which the film stack 400 is cooled is less than the period of time needed to deposit the interlayer 408. In another example, the period of time $\Delta t_{cool}$ at which the film stack 400 is cooled is equal to or greater than the period of time needed to deposit the interlayer 408. In yet another example, when the film stack 400 is actively cooled, the period of time $\Delta t_{cool}$ can be any desired period of time between about 1 second to about 60 seconds, incremented by 1 second. Applicant notes that the film stack 400 can be actively cooled for the same periods of time $\Delta t_{cool}$ as deposition of the film stack 400 is paused, as described above.

After the film stack 400 is processed to form a bulk layer 404 that has a desired thickness by performing one of more of the blocks 504-508 multiple times, according to the method 500 disclosed herein, the film stack 400 may be returned factory interface 104. In one example, the sequence of blocks 504-508 were performed at least two times, such as at least four times, or even at least 20 times. The substrate 201 may be moved from the second processing chamber 164, and transferred to the first processing chamber 160. The film stack 400 may then be transferred from the first processing chamber 160 to the loading dock 140 by the first robot 132. Subsequently, the film stack 400 may be returned to the factory interface 104.

Figure 6:
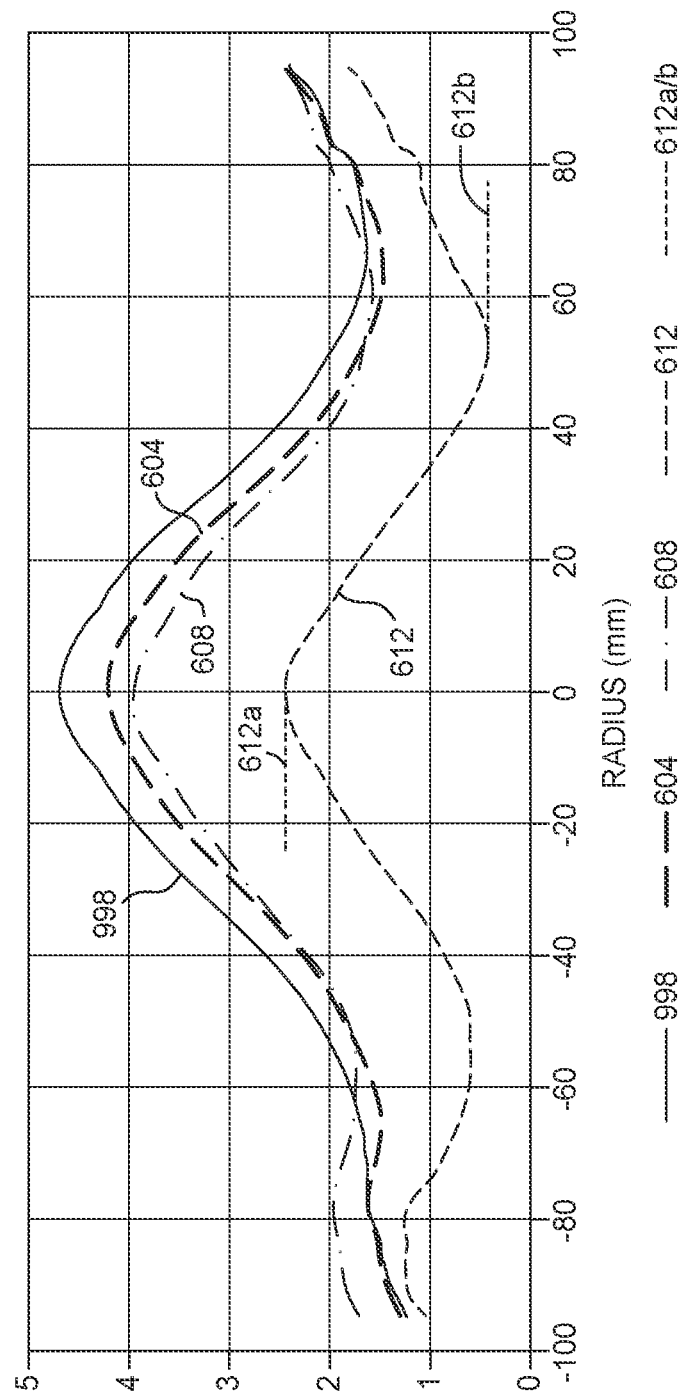
FIG. 6 is a graph illustrating how a stress profile changes with respect to a cooling time when the substrate temperature is reduced.

FIG. 6 is a graph illustrating how a stress profile across the substrate 201 changes with respect to a cooling time during the formation of a series of interlayers 408 using a desirable process sequence, such as performing the sequence of blocks 504-508 multiple times.

The graph 600 illustrates the effect of increasing cooling time (e.g. $\Delta t_{cool}$) at block 508 on radially measured stress values across the film stack 400. Lines 604-612 represent the stress profile radially across the substrate 201 for the bulk layer 404 deposited after performing block 508. Each line 604-612 demonstrates a stress profile across the surface of the substrate 201, at different cooling times. For example, line 604 represents a stress profile in a film stack 400 where the process(es) performed during block 508 include the use of a cooling time of about 10 seconds. Line 608 demonstrates a stress profile in a film stack 400 where a cooling time of about 20 seconds is used during block 508. The line 612 represents a stress profile in a film stack 400 where the process(es) performed during block 508 include the use of a cooling time of about 50 seconds. In at least one example, the cooling time is about 40 seconds during block 508. A comparative example 998, demonstrates the stress profile across the substrate 201 when portions of the bulk layer 404 are deposited without the intervening reduction in temperature during block 508 between deposition steps. Stated differently, no cooling time is introduced during the formation of layers in the formation of the comparative example 998.

As illustrated in FIG. 6, as the cooling time increases, the variations in center-to-edge stress profile decreases (e.g. a standard deviation) and the average or mean stress profile across the substrate 201 decreases. For example, in the comparative example 998, a maximum stress value is about 4.8 and a minimum stress value is about 1.5. However, a maximum value 612a of line 612 is about 2.5 and a minimum value 612b is at about 0.6. Comparing the maximum value 612a and minimum value 612b in the line 612 to the maximum stress value and minimum stress value of the comparative example 998 demonstrates an average reduction in stress across the substrate 201 as cooling time increases. Additionally, as shown in line 604, at the center of the substrate 201 (i.e. where substrate 201 radius is 0), when the cooling time is about 10 seconds, there is a 21% drop in stress with respect to the comparative example 998. Line 608 illustrates that when the cooling step is about 20 seconds, there is a 32% drop in stress. Line 612 demonstrates about a 98% drop in stress, with respect to the comparative example 998. It is understood that these examples are only illustrative and incorporate other examples not specifically detailed herein, based upon the differences between the lines 604-612, and differences between the lines 604-612 and the comparative example 998.

Figure 7:
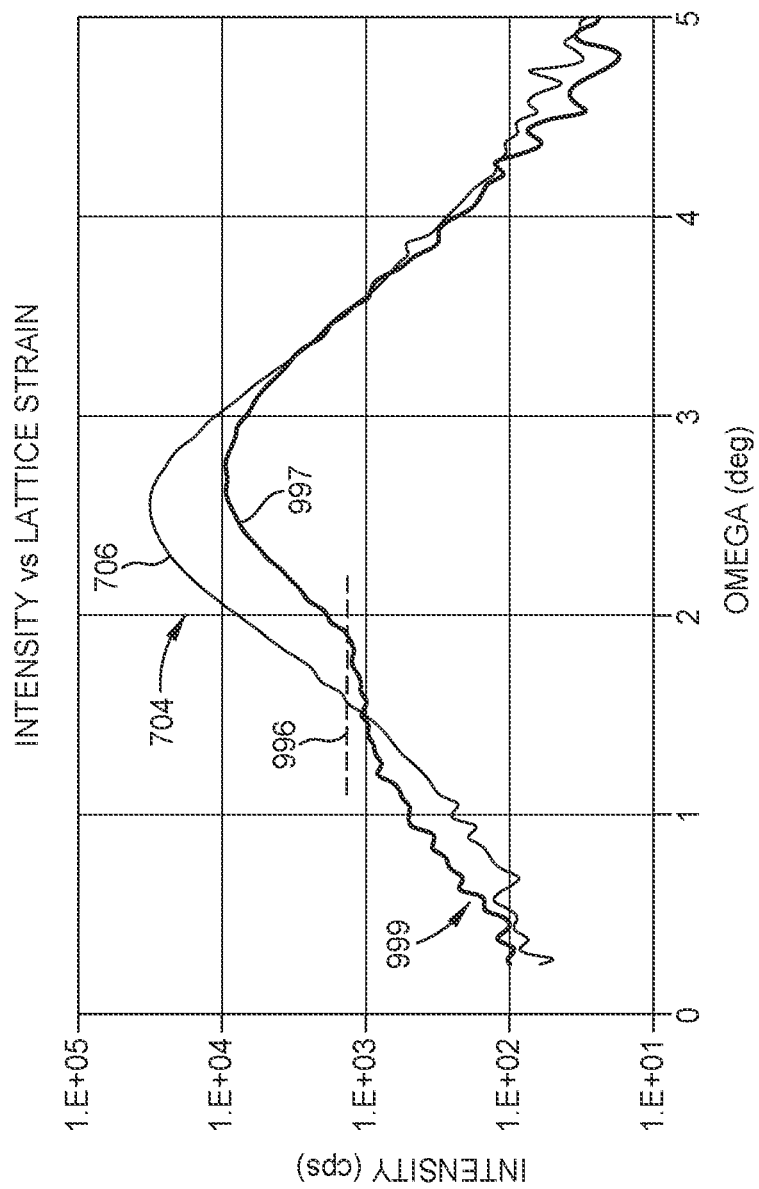
FIG. 7 illustrates the degree of crystallization variation in thin film layers formed from multiple successive interlayers.

FIG. 7 illustrates the degree of crystallization variation in a thin film layer formed from multiple successive interlayers 408 that were formed with a varying intermediate cooling step (i.e., block 508).

The curves shown in FIG. 7 are examples of rocking curves. A rocking curve, which are typically formed by use of an XRD inspection process, is able to detect the presence of one or more crystal orientations in a deposited film layer formed from multiple interlayers 408. The results of the generated rocking curves enables one to identify attributes of defects found in a formed layer, such as dislocation density, mosaic spread, curvature, misorientation of adjacent crystalline structures, and crystalline inhomogeneity. Measuring a peak of a given rocking curve corresponds to the regularity of the atomic spacing (i.e., d-spacing), which describes a distance between planes of atoms in the crystal structure of a given interlayer 408(n). Measuring the relative amplitude of the peak may also provide parameters such as composition, strain, and relaxation. A graph 700 includes a curve 704 of the bulk layer 404 that was generated by reducing the temperature between formation of successive interlayers (e.g. 408(n) and 408(n+1)), utilizing the method of block 504 through block 508 multiple times. Curve 704 was formed with an interlayer deposition time of about 10 seconds that are performed about 20 times. Otherwise stated, the curve 704 shows the formation of about 20 interlayers 408. Accordingly, the curve 704 has a single peak 806 indicating that an interface of two adjacent groups of successive interlayers 408 and formed interlayers 408 have substantially the same crystal orientation. For example, a first group of interlayers can be interlayer 408(1) and interlayer 408(2), and the cooling time at block 508 occurs between interlayer 408(1) and interlayer 408(2).

While this graph shows a configuration of 20 groups of successive interlayers 408, it has been found that forming more than about 10 groups of successive interlayers 408, with a block 508 process step interposed between each deposition step, achieves a film stack 400 having similar properties as illustrated in the curve 704. Additionally, it has been found that the cooling time between adjacent groups of successive interlayers 408 can be from about 10 to about 40 seconds. Each interlayer 408 represented in the curve 704 was deposited for a period of time between about 10 seconds to about 50 seconds.

A comparative example 999 is another curve that was generated on a bulk film layer (not shown) that included two interlayers 408 deposited for a first period and a second period of time. The comparative example 999 is deposited in two depositions without interim cooling of the substrate 201 at block 508. The first period is about 500 seconds or greater, and a second period being about 1500 seconds or greater. In the comparative example 999, a first peak 996 and a second peak 997 indicate that an interface of two successive interlayers 408 have a different crystal orientation, which may originate from small angle grain boundaries at the interface or each interlayer 408. As illustrated, the comparative example 999 shows a first peak 996 between angle 1 and angle 2. The first peak 996 has a value of about 2.7. A second peak 997 is shown in the comparative example 999 between angle 2 and angle 3. The second peak 997 has a value of about 1.8. The dual peak (i.e. first peak 996 and second peak 997) of the comparative example 999 demonstrates the undesirable presence of variation in the crystal orientation between a first interlayer 408(n) and a second interlayer 408(n+1).

The curve 704 demonstrates a thin film layer that includes a single peak 806 between angle 0 and angle 5. The single peak 806 in curve 704 indicates a greater crystal orientation uniformity at the interface of successive interlayers 408 with respect to the comparative example 999. It is believed that when forming the bulk layer 404 at blocks 504-508, as the number of cycles (i.e., cycles of blocks 504-508) increases, the number of defects at the interface of successive interlayers 408 decreases. As the number of cycles increases to between about 5 cycles and between about 15 cycles, the defects between the successive interlayers 408 significantly diminishes such that the single peak 806 remains. For example, when the number of cycles increases above about 10, the single peak 806 is formed. The interface of the successive interlayers 408 becomes smoother, such that the crystal orientation between successive interlayers 408 creates an average slope of about 45 degrees on the rocking curve of graph 700.

Figure 8:
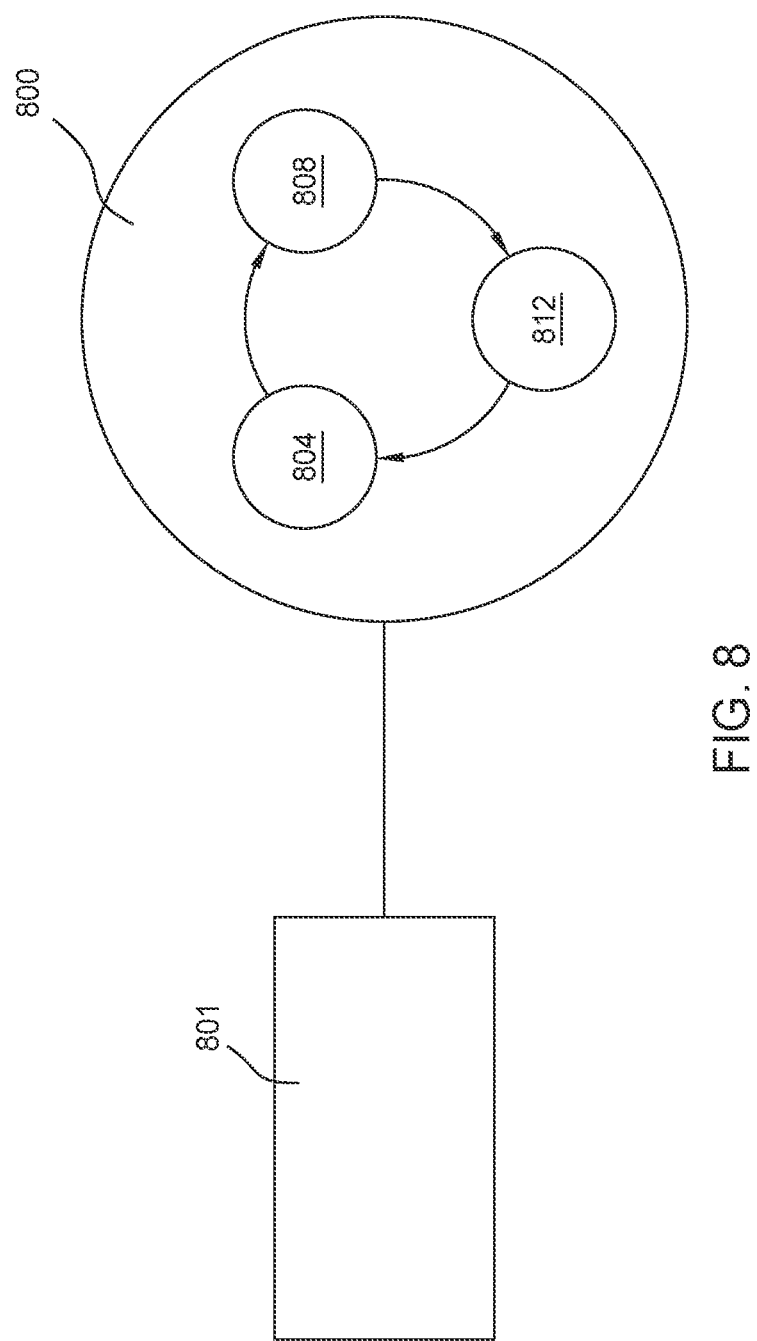
FIG. 8 is a plan view of a controller 800 that can provide instructions to the any one of the processing chambers depicted in FIGS. 1-3.

FIG. 8 is a plan view of a controller 800 that can provide instructions to the any one of the processing chambers depicted in FIGS. 1-3.

An optional display unit 801 may be coupled to the controller 800. The controller 800 includes a processor 804, a memory 808, and support circuits 812 that are coupled to one another. The controller 800 may be on-board the cluster tool 100, or in an alternative example, the controller 800 may be on-board one of the processing chambers in FIG. 2 or 3, or a remote device (not shown).

The display unit 801 includes an input control unit, such as power supplies, clocks, cache, input/output (I/O) circuits, coupled to the various components of the display unit 801 to facilitate control thereof. The processor 804 may be one of any form of general purpose microprocessor, or a general purpose central processing unit (CPU), each of which can be used in an industrial setting, such as a programmable logic controller (PLC).

The memory 808 is non-transitory and may be one or more of readily available memory such as random access memory (RAM), read only memory (ROM), or any other form of digital storage, local or remote. The memory 808 contains instructions, that when executed by the processor 804, facilitates the operation of any of the processing chambers illustrated in FIGS. 1-3. The instructions in the memory 808 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

In one example, the controller 800 may be implemented as the program product stored on a computer-readable storage media (e.g. 808) for use with a computer system (not shown). The program(s) of the program product define functions of the disclosure, described herein.

What is claimed is:

1. A method of forming a piezoelectric film, comprising:
   (a) depositing a first piezoelectric film layer on a surface of a substrate by a first physical vapor deposition (PVD) process;
   (b) depositing a second piezoelectric film layer, on top of and in contact with the first piezoelectric film layer, by a second physical vapor deposition (PVD) process;
   (c) reducing a temperature of the substrate after forming the first piezoelectric film layer and before forming the second piezoelectric film layer, wherein the temperature is reduced by performing a process for a first period of time; and
   additionally performing processes (a), (b) and (c) one or more times, wherein process (c) in the additionally performed processes (a), (b) and (c) is performed for a second period of time, and the second period of time being different than the first period of time.

2. The method of claim 1, wherein process of depositing the first piezoelectric film layer and the process of depositing a second piezoelectric film layer have at least one process parameter that is different, and the at least one process parameter is selected from a group consisting of deposition process pressure, bias power and deposition process time.

3. The method of claim 1, wherein the first PVD process and the second PVD process each comprise:
   sputtering a material from a target that comprises scandium,
   while flowing a process gas that includes argon and nitrogen at a ratio of between about 1 to 1 and about 5 to 1.

4. The method of claim 1, wherein the first PVD process and the second PVD process each comprise:

sputtering a material from a target that comprises aluminum,
while flowing a process gas that includes argon and nitrogen at a ratio of between about 1 to 1 and about 5 to 1.

5. The method of claim 1, wherein the first piezoelectric film layer and the second piezoelectric film layer comprise a same material combination, and a time to form of the first piezoelectric film layer and the second piezoelectric film layer in less than about 40 seconds.

6. The method of claim 1, further comprising:
forming a third piezoelectric film layer, by use of a third PVD process, on the substrate at a first bias power for a third period of time; and
cooling the first piezoelectric film layer and the second piezoelectric film layer before the forming of the third piezoelectric film layer.

7. The method of claim 1, wherein the first period of time and the second period of time is each between about 6 seconds and about 60 seconds, wherein an inspection of an interface between the first piezoelectric film layer and the second piezoelectric film layer generates a rocking curve substantially having a single peak.

8. The method of claim 1, further comprising flowing a process gas that comprises argon (Ar) and nitrogen (N) while depositing the first piezoelectric film layer on the surface of the substrate.

9. A method of forming a piezoelectric film, comprising:
(a) depositing, in a first processing chamber, a first piezoelectric film layer on a surface of a substrate by a first physical vapor deposition (PVD) process;
(b) depositing, in the first processing chamber, a second piezoelectric film layer, on top of and in contact with the first piezoelectric film layer, by a second PVD process;
(c) reducing a temperature of a substrate after forming the first piezoelectric film layer and before forming the second piezoelectric film layer, wherein the temperature is reduced by performing a process for a first period of time; and
additionally performing processes (a), (b) and (c) one or more additional times, wherein the additionally performed process (c) is performed for a second period of time, and the second period of time being different than the first period of time.

10. The method of claim 9, wherein process (c) further including pausing the deposition process for a pausing period of time, the pausing period of time being from about 3 seconds to about 50 seconds, and the first period of time is between about 10 seconds and about 60 seconds, and the second period of time is between about 10 seconds and about 50 seconds.

11. The method of claim 9, wherein process of depositing the first piezoelectric film layer and the process of depositing a second piezoelectric film layer have at least one process parameter that is different, and the at least one process parameter is selected from a group consisting of deposition process pressure, bias power and deposition process time.

12. The method of claim 9, wherein the first PVD process and the second PVD process each comprise:
sputtering a material from a target that comprises scandium,
while flowing a process gas that includes argon and nitrogen at a ratio of between about 1 to 1 and about 5 to 1.

13. The method of claim 9, wherein the first PVD process and the second PVD process each comprise:
sputtering a material from a target that comprises aluminum,
while flowing a process gas that includes argon and nitrogen at a ratio of between about 1 to 1 and about 5 to 1.

14. The method of claim 9, wherein reducing the temperature of the substrate after forming the first piezoelectric film layer and before forming the second piezoelectric film layer further comprises:
actively cooling the first piezoelectric film layer before depositing the second piezoelectric film layer, and
wherein depositing each of the first piezoelectric film layer and the second piezoelectric film layer in less than about 60 seconds.

15. The method of claim 9, further comprising:
depositing a third piezoelectric film layer on the substrate at a first bias power for a third period of time; and
cooling the first piezoelectric film layer and the second piezoelectric film layer before depositing the third piezoelectric film.

16. The method of claim 15, further comprising cooling the first piezoelectric film layer and the second piezoelectric film layer before depositing a third piezoelectric film layer over the first piezoelectric film layer and the second piezoelectric film layer.

17. An apparatus for processing a substrate, comprising:
a processor coupled to at least one non-transitory computer readable medium, wherein the at least one non-transitory computer readable medium includes instructions which when executed by the processor are configured to perform a method comprising:
(a) depositing a first piezoelectric film layer on a surface of a substrate by a first physical vapor deposition (PVD) process;
(b) depositing a second piezoelectric film layer, on top of and in contact with the first piezoelectric film, by a second physical vapor deposition (PVD) process;
(c) reducing a temperature of the substrate after forming the first piezoelectric film layer and before forming the second piezoelectric film layer, wherein the temperature is reduced by performing a process for a first period of time; and
additionally performing processes (a), (b) and (c) one or more times, wherein process (c) in the additionally performed processes (a), (b) and (c) is performed for a second period of time, and the second period of time being different than the first period of time.

18. The apparatus of claim 17, wherein the instructions executed by the processor are further configured to cause:
the first piezoelectric film layer to be actively cooled before depositing the second piezoelectric film layer, and
the first piezoelectric film layer and the second piezoelectric film layer to be deposited in less than about 60 seconds.

19. The apparatus of claim 17, wherein the instructions executed by the processor are further configured to cause:
the second piezoelectric film layer to be deposited on the substrate using a first bias power that is different than a bias power generated during the deposition of the first piezoelectric film layer; and
the first piezoelectric film layer and the second piezoelectric film layer to be cooled from a first temperature to a second temperature before depositing a third piezoelectric film layer.

20. The apparatus of claim 19, wherein the instructions executed by the processor are further configured to cause the first piezoelectric film layer and the second piezoelectric film layer to be formed by:
- sputtering a material from a target that comprises aluminum, or aluminum and scandium,
- while flowing a process gas that includes argon and nitrogen at a ratio of between about 1 to 1 and about 5 to 1.

* * * * *